United States Patent [19]

Schweitzer

[11] 4,234,847
[45] Nov. 18, 1980

[54] FAULT INDICATOR

[76] Inventor: Edmund O. Schweitzer, 1002 Dundee Rd., Northbrook, Ill. 60118

[21] Appl. No.: 958,103

[22] Filed: Nov. 6, 1978

[51] Int. Cl.² .............................................. G01R 1/20
[52] U.S. Cl. .................................... 324/146; 340/654
[58] Field of Search ................ 324/146, 133; 340/654, 340/660, 662, 664

[56] References Cited

U.S. PATENT DOCUMENTS

| 3,460,038 | 8/1969 | Ziegler | 324/146 |
| 3,761,731 | 9/1973 | Burgett | 324/146 |

Primary Examiner—Michael J. Tokar
Attorney, Agent, or Firm—Lockwood, Dewey, Alex & Cummings

[57] ABSTRACT

An automatically resettable fault indicator includes a rotatably-mounted target viewable from the exterior of the indicator for indicating circuit status. The target is positioned in a reset-indicating state by a reset circuit which periodically energizes a first winding to position a permanent magnet mounted for rotation with the target. Upon occurrence of a fault circuitry within the indicator energizes a second winding to reposition the target to a fault-indicating position. A delay circuit in the fault-responsive circuitry prevents simultaneous energization of the first and second windings, and an auxiliary pole piece associated with the main pole piece assists in repositioning the target to the fault-indicating position, for improved performance and reliability in responding to fault currents.

15 Claims, 13 Drawing Figures

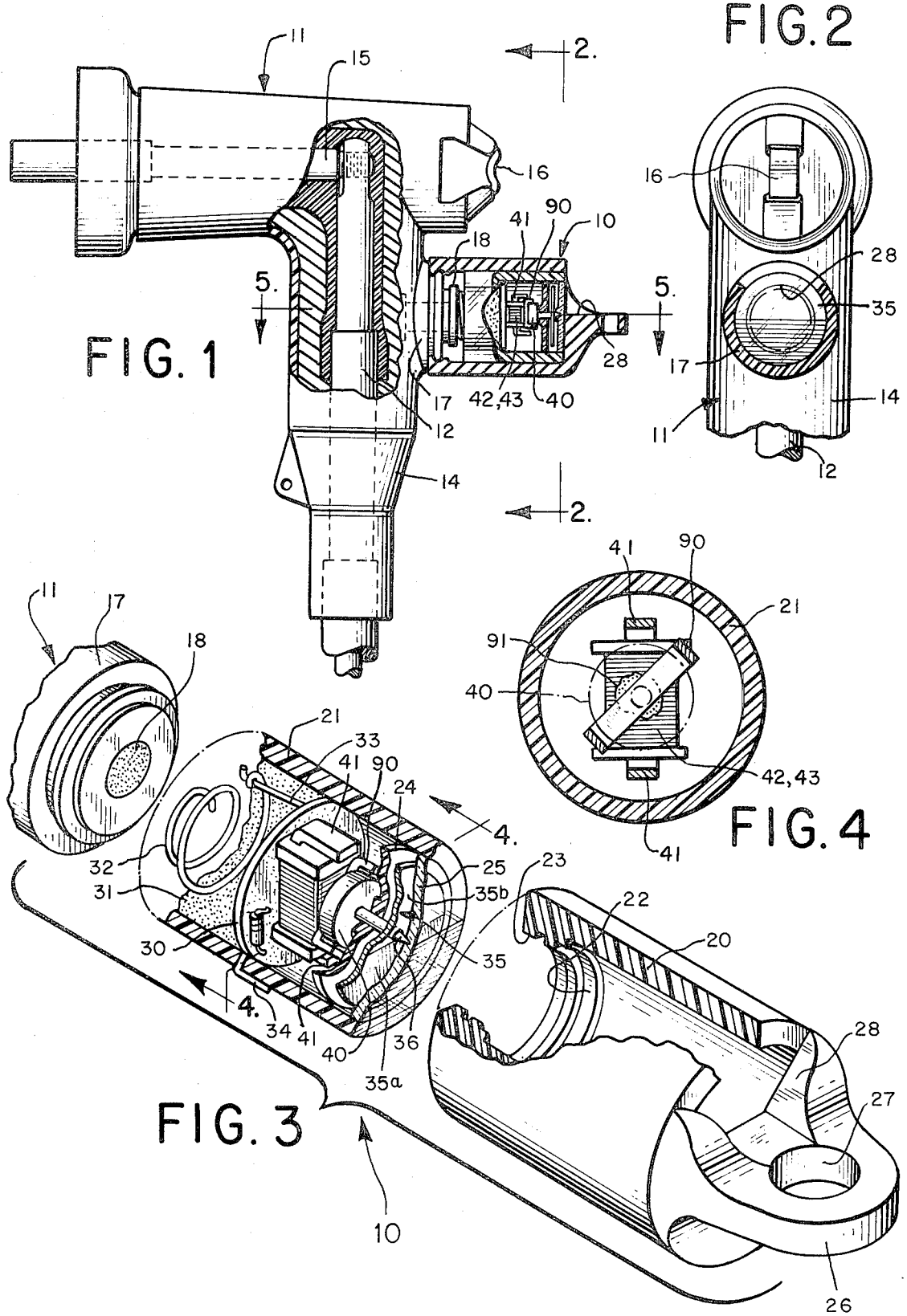

FAULT INDICATOR

BACKGROUND OF THE INVENTION

The present invention relates generally to current sensing devices for electrical systems, and more particularly to automatically resetable alternating current fault indicators.

With the increased use of underground electrical distribution systems wherein primary and secondary feeder cables are directly buried in the ground, the need has arisen for improved detection apparatus for determining the location of a short circuit or fault in the system cables or associated electrical components. Since the cables are buried, it is often difficult to determine the exact location of a fault, particularly where there are several distribution transformers, each serving multiple customers.

Various types of fault indicators have been constructed for detecting faults in such systems, including clamp-on type fault indicators, which clamp directly over cables in the system, and test-point type fault indicators, which are mounted over test points in the cables or associated connectors. Such fault indicators may be either of the manually reset type, wherein it is necessary that the indicator be physically reset following each fault, or of the automatically reset type, wherein a fault indication is reset upon restoration of line current. The automatically reset type is better adapted for use in underground distribution systems in that it is not necessary to gain access to the fault indicator following occurrence of a fault. Examples of such automatically reset fault indicators are found in products manufactured by E. O. Schweitzer Mfg. Co. of Mundelein, Ill., and in U.S. Pats. Nos. 3,676,740, 3,906,477 and 4,063,171 of the present inventor.

Detection of fault currents by self-resetting fault indicators is often most advantageously accomplished by means of a reed switch located within the indicator housing having contacts in close proximity to the conductor being monitored. Upon occurrence of an abnormally high fault-associated magnetic field around the conductor, the contacts close and actuate circuitry which magnetizes an internal pole piece to position to a trip position a target indicator visible from the exterior of the indicator. Upon restoration of current in the conductor another circuit is actuated to reposition the target indicator to a reset non-fault indicating position.

The present invention is directed to improvements in self-reseting fault indicators which provide for more reliable operation and improved performance. Specifically, the present invention provides electrical circuit improvements which preclude the possibility of a fault not being indicated as a result of simultaneous occurrence of trip and reset functions, and magnetic circuit improvements which preclude the possibility of a fault not being indicated as a result of the target indicator remaining fixed in a static untripped position following remagnetization of the fault indicator pole piece.

Accordingly, it is a general object of the present invention to provide a new and improved self-resetting fault indicator.

It is more specific object of the present invention to provide a new and improved self-resetting fault indicator having improved reliability and performance.

SUMMARY OF THE INVENTION

The invention is directed to a fault indicator for indicating the occurrence of a fault current in an electrical conductor. The indicator includes a housing adapted for mounting in proximity to the conductor, and status indicating means having a reset-indicating state and a fault-indicating state. First circuit means are provided for conditioning the status indicating means to the reset state, the first circuit means being periodically operable from an external excitation source, and second circuit means are provided for conditioning the status indicating means to the fault-indicating state in response to an applied control effect. Fault detecting means responsive to occurrence of a fault current in the conductor, and time delay means responsive to detection of a fault by the fault detecting means for provided for actuating the second circuit means after a predetermined delay period following the fault to preclude simultaneous actuation of the first and second circuit means.

The invention is further directed to a fault indicator which comprises a housing adapted for mounting in close proximity to the conductor, status indicating means including a permanently magnetized movable member within the housing having a first position corresponding to a reset state, and a second position corresponding to a fault-indicating state, and means comprising a main magnetic pole piece having magnetic poles arranged in magnetic flux communication with the indicating member. Means are provided for conditioning the main magnetic pole piece from an initial magnetic state to an opposite magnetic state upon occurrence of a fault current in the conductor, the movable status-indicating member being urged from the first position to the second position as a result thereof, and means comprising an auxiliary pole piece in magnetic flux communication with the magnetic pole piece and magnetizable as a result of the magnetic flux therein are provided for assisting movement of the movable indicating member from the first reset-indicating position to the second fault-indicating position.

BRIEF DESCRIPTION OF THE DRAWINGS

The features of the present invention, which are believed to be novel, are set forth with particularity in the appended claims. The invention, together with the further advantages thereof, can best be understood by reference to the following description taken in conjunction with the accompanying drawings, in the several figures in which like reference numerals identify like elements, and in which:

FIG. 1 is an elevational view, partially in section, illustrating a resettable test-point fault indicator constructed in accordance with the present invention mounted on the test-point terminal of a plug-in terminal connector.

FIG. 2 is a cross-sectional view of the fault indicator and connector taken along line 2—2 in FIG. 1.

FIG. 3 is a fragmentary perspective view of the fault indicator in a partially disassembled state;

FIG. 4 is an enlarged cross-sectional view of the fault indicator taken along line 4—4 in FIG. 3.

DESCRIPTION OF THE PREFERRED EMBODIMENT

Figure 5:
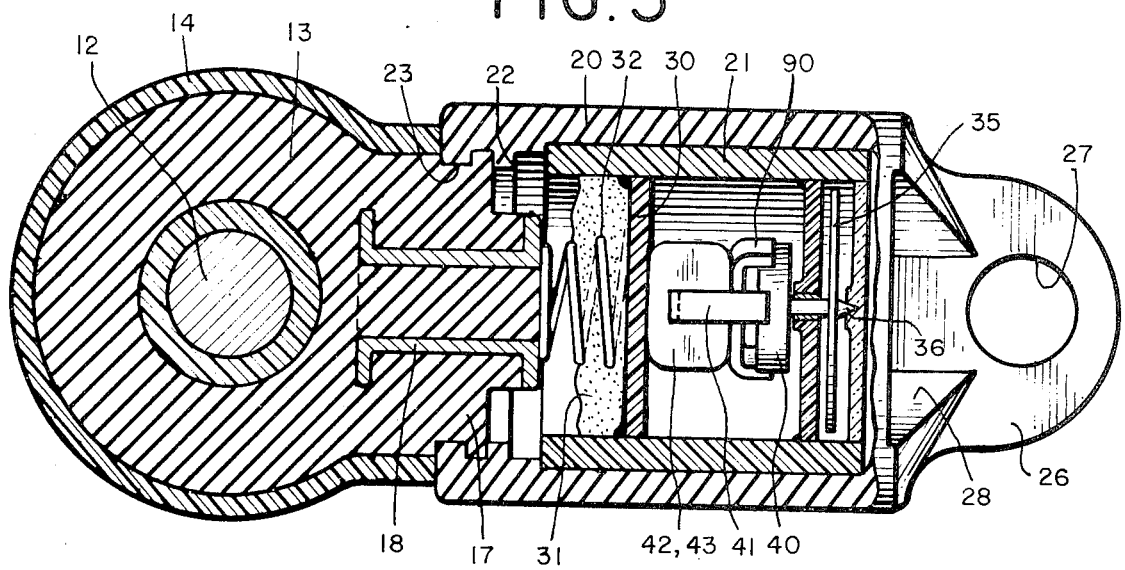
FIG. 5 is an enlarged cross-sectional view taken along line 5—5 in FIG. 1 showing the fault indicator assembled on the test-point of the terminal connector.

Referring to the drawings, and particularly to FIGS. 1-4, a fault indicator 10 constructed in accordance with the invention is shown in conjunction with a conventional plug-in terminal connector 11 of the type commonly used in high voltage alternating current systems for establishing plug-in connections to transformers or other devices (not shown). As shown, the connector 11 includes generally an axial conductor 12 extending through an insulating jacket 13 encased in an electrically-conductive sheath 14, the sheath being grounded in accordance with conventional practice. A plug-in receptacle 15 extends from conductor 12 and is arranged to connect with a complimentary contact on the transformer or device. An arcuate member 16 having ends anchored in the conductive sheath 14 extends from the connector to receive the hook end of a lineman's tool to facilitate removal of the connector from the transformer or other device.

In accordance with conventional practice, connector 11 includes a test-point terminal 17 which comprises a projection of the insulating jacket 13 and an electrical contact 18 embedded in the end thereof.

The fault indicator 10 comprises an electrically conductive hollow rubber outer shell 20 which is open at one end for mounting to the test-point terminal 17. A correspondingly sized cylindrical transparent plastic housing 21 containing the electrical components of the voltage indicator circuit is contained within the rubber outer shell, and held in position within the shell by an annular flange portion 22 on the inside surface of the shell. The annular flange portion also extends inwardly at the open end of the shell to form a rim portion 23 which secures the shell over the test-point. The cylindrical housing 21 includes an integral partition 24 which serves a mask and spacing element, and a transparent end cap portion 25 which is sonically welded to the end of the housing.

When the test-point cap 10 is installed on the test-point terminal 17 the annular end flange portion 23 of the outer shell snaps over an annular rib portion 26 on the terminal. The outer surface of the annular end flange 23 engages the electrically conductive connector sheath 13 to establish an electrical ground for shell 20. At the closed end of the shell a tab portion 26 having an aperture 27 there-through is provided to facilitate the removal of the testpoint cap with a conventional hooked lineman's tool. A window 28 in the end of the outer shell allows the end of housing 21 to be viewed.

Referring to FIGS. 3 and 5, a disc-shaped insulator board 30 is positioned perpendicular to the axis of the housing in a location intermediate the ends thereof. The insulator board, which may be secured in position by an epoxy material 31 filling the housing, serves as mounting means for the electrical components of the fault indicator circuitry. An electrical connection is established between this circuitry and test-point 18 be means of a helical spring 32, the spring being connected to a wire conductor 33 extending from the circuit board at one end, and being resiliently pressed against contact 18 at its other end. An electrical ground connection is established to the circuit board by means of an additional electrical conductor 34 compressively wedged between housing 21 and the electrically conductive grounded outer shell 20.

To provide an indication of the occurrence of a fault current in conductor 12, the fault indicator includes within the lower end of housing 21 a disc-shaped target 35 which is mounted for rotation on a pivot 36. The face of the target disc has a red segment 35a and a white segment 35b, only one of which is visible at a time through window 28 and the transparent end of housing 21.

Figures 7A, 7B:
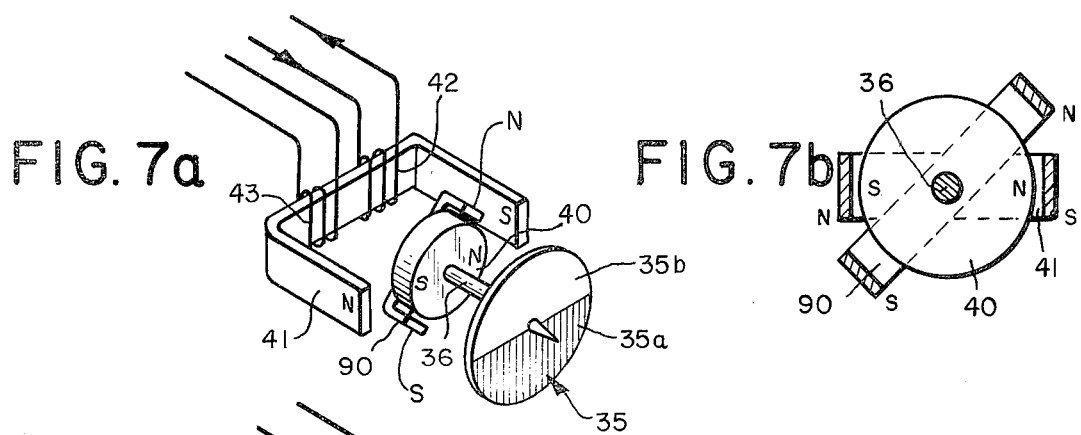
FIGS. 7a and 7b are diagrammatic views of the principal components of the fault indicator in a reset state.
Figures 8A, 8B:
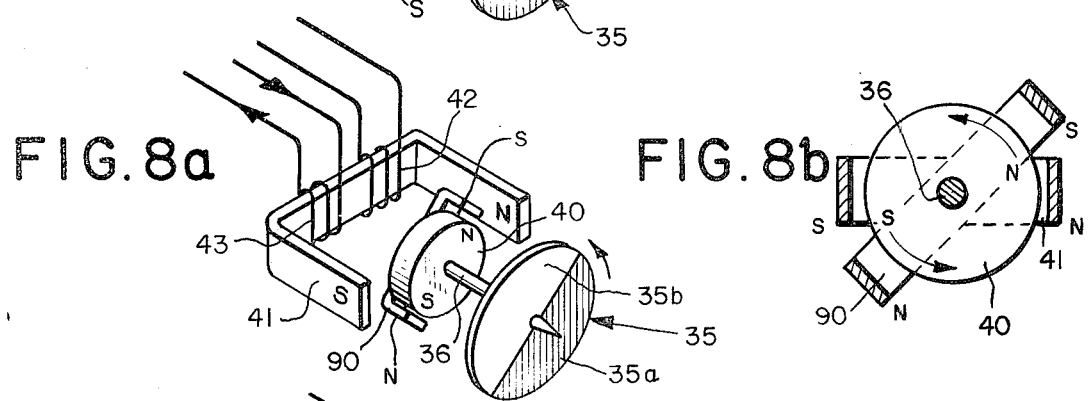
FIGS. 8a and 8b are diagrammatic views similar to FIGS. 7a and 7b respectively, showing the principal components of the fault indicator in transition between a reset state and a tripped state.
Figures 9A, 9B:
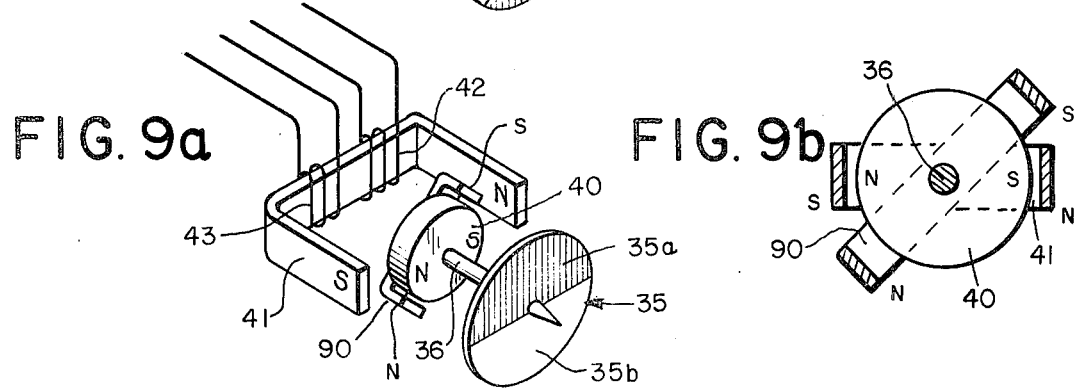
FIGS. 9a and 9b are diagrammatic views similar to FIGS. 7a and 7b, respectively, showing the principal components of the fault indicator in a tripped state.

Secured to and pivotal with target 35 is a target permanent magnet 40 which is formed of a magnetic material having a high coercive force, such as ceramic, and is magnetically polarized to form two magnetic poles of opposite gender, as indicated in FIGS. 7-9, with opposite magnetic polarities along a diameter of the magnet. The target disc 35 and its permanent magnet 40 are biased to the position shown in FIGS. 7a and 7b when the fault indicator is in a non-tripped or reset condition by means of a stationary generally U-shaped magnetic pole piece 41 which is located within housing 21 generally co-planar with the axis of rotation of target disc 35.

The pole piece 41, which is preferably formed of a magnetic material having a relatively low coercive force, such as a chrome steel, is biased at its projecting ends to the magnetic polarities indicated in FIG. 7. As shown in FIGS. 3 and 5, the ends of the pole piece extend along the side wall of housing 21, in close proximity to target magnet 40. As a result, the opposite polarity magnetic poles of the target magnet 40 are attracted to position the target disc 35 as shown. In this position the red segment 35a of the target disc is not visible through window 28, and all that is seen is the white segment 35b.

On the occurrence of a fault current in conductor 12, which may, for example, exceed 400 amperes, pole piece 41 is remagnetized to the magnetic polarities shown in FIGS. 8 and 9 by momentary energization of a trip winding 42 on the center section of the pole piece. As a result, the poles of magnet 40 are repelled by the adjacent like gender poles of the pole piece and the target disc is caused to rotate 180° to the tripped position shown in FIG. 9. In this position, the red segment 35b of the target disc is visible through window 28, and a lineman viewing the fault indicator is advised that a fault current has flowed through conductor 12.

The target disc remains in the fault indicating position until the ends of pole piece 41 are subsequently re-magnetized to the magnetic polarities shown in FIG. 7 by momentary energization of a reset winding 43 on the center section of the pole piece. As a result, the target magnet 40, and hence the target disc 35, are caused to rotate from the tripped position shown in FIG. 9 to the reset position shown in FIG. 7, and the fault indicator is conditioned to respond to a subsequent fault current.

Figure 6:
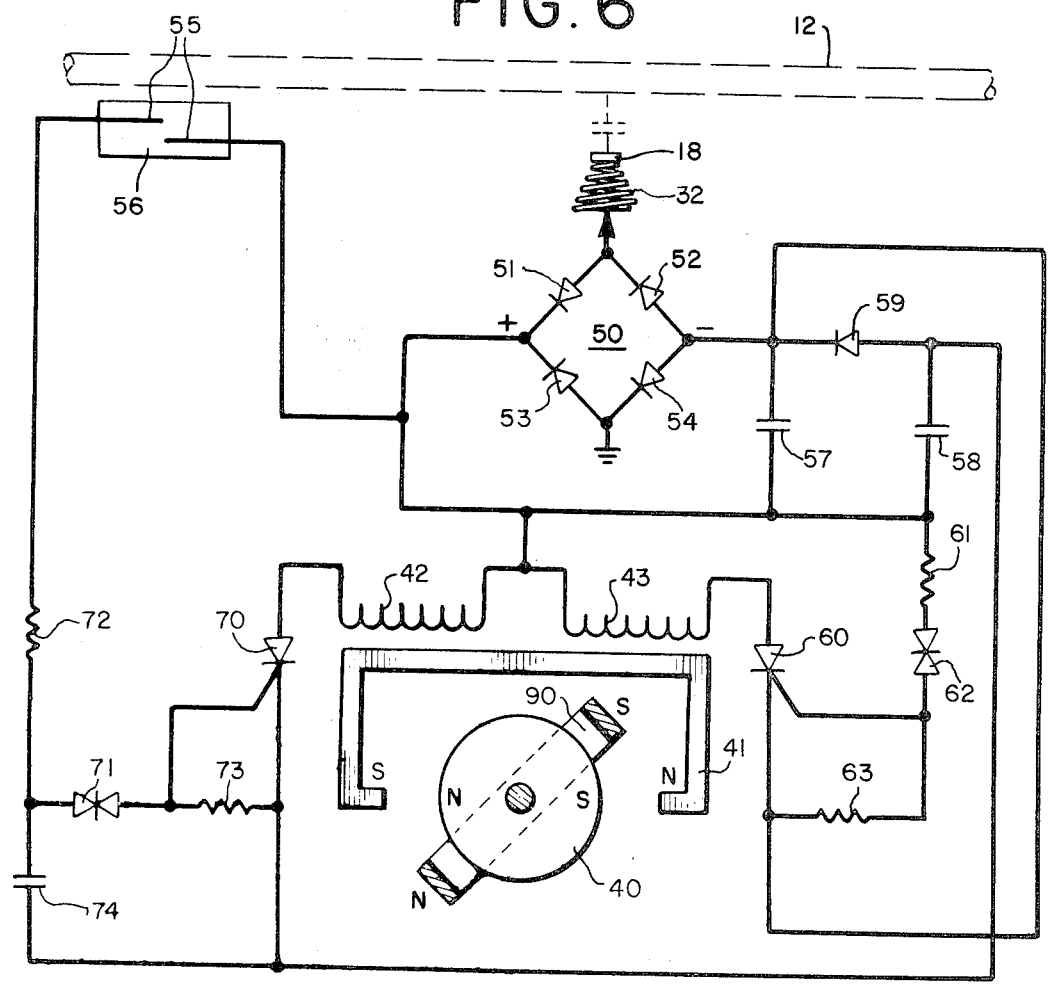
FIG. 6 is an electricl schematic diagram of the fault indicator.

Energization of windings 42 upon occurrence of a fault current in conductor 12, and energization of winding 43 upon restoration of current in conductor 12 following a fault, is accomplished by means of externally powered circuitry contained within the fault indicator. Referring to the schematic diagram shown in FIG. 6, windings 42 and 43 are connected end-to-end for independent energization upon occurrence of fault and reset conditions, respectively. Operating power for these windings is obtained by means of a bridge rectifier network 50, consisting of diodes 51–54. One input terminal of this network, formed at the juncture of the anode of diode 51 and the cathode of diode 52, is connected through the helical spring 32 to test-point contact 18. The other input terminal, formed at the anode of diode 53 and the cathode of diode 54, is connected to ground through the electrically conductive sheath 20 of the fault indicator. With this arrangement, high voltage alternating current carried in conductor 12 is capacitively coupled to the bridge rectifier network, resulting in the production of a pulsating unidirectional current at the output terminals of the network.

The positive polarity output terminal of the bridge rectifier network, formed at the cathodes of diodes 51 and 53, is connected to one contact 55 of a reed switch 56, to the end terminals of windings 42 and 43, and to respective terminals of capacitors 57 and 58. The negative polarity output terminal of the bridge rectifier network, formed at the juncture of the anodes of diodes 52 and 54, is connected directly to the remaining terminal of capacitor 57, and through a forward-biased diode 59 to the remaining terminal of capacitor 58. With this arrangement, capacitors 57 and 58 are charged by the pulsating unidirectional current developed by bridge rectifier network 50 during normal current flow in conductor 12.

To provide for periodic energization of reset winding 43 during normal current flow-in conductor 11, the remaining end terminal of winding 43 is connected through a silicon controlled rectifier (SCR) 60 to the negative polarity terminal of capacitor 57. Periodic conduction through SCR 60 is obtained by connecting the gate electrode of that device to the positive polarity output terminal of bridge rectifier network 50 through a resistor 61 and a bilateral diode 62, and to the cathode of SCR 60 by a resistor 63. With this arrangement, SCR 60 is periodically triggered into conduction when the voltage developed across bilateral diode 62 as a result of capacitor 57 being charged by bridge rectifier 50 reaches the threshold level of the bilateral diode.

In operation, under normal current flow conditions, the voltage developed across capacitor 57 as the capacitor is charged by bridge rectifier network 50 progressively increases with time, until the threshold breakdown voltage of bilateral diode 62 is reached, at which time SCR 60 is triggered and capacitor 57 discharges through winding 43. Diode 59 prevents capacitor 58 from being discharged through SCR 60 and winding 43, leaving the capacitor available for energizing winding 42 in response to a fault condition. In practice, the breakdown voltage of bilateral diode 62 may be in the order of 34 volts, and the time required for capacitor 58 to reach this threshold level with a voltage level of 4,400 volts on conductor 12 may be approximately 2 minutes. In any case, the voltage level within conductor 12 is not critical to the operation of the reset circuit, and has only the effect of changing the frequency of the reset cycle.

Trip winding 42 is energized upon occurrence of a fault current in conductor 12 by discharge of capacitor 58 through a second silicon controlled rectifier 70. Conduction is established through SCR 70 by closure of the contacts 55 of reed switch 56, which is positioned within housing 21 in close proximity to conductor 12 such that the alternating magnetic field produced in the vicinity of conductor 12 upon generation of a fault current is sufficient to close the contacts of the reed switch. The gate electrode of SCR 70 is connected through a bilateral diode 71 and a resistor 72 to the remaining contact of reed switch 56, and by a resistor 73 to the SCR cathode. The juncture of resistor and bilateral diode 71 is connected by a capacitor 74 to capacitor 58.

Upon occurrence of a fault current in conductor 12, the positive polarity output terminal of bridge rectifier network 50 is connected through the closed contacts of reed switch 56 and the circuit comprising resistor 72, bilateral diode 71 resistor 73 and capacitor 74 to the gate electrode of SCR 70, causing that device to be rendered conductive following a predetermined time delay. At this time capacitors 57 and 58 are caused to discharge through SCR 70 and energize winding 42. The resulting magnetic flux in the U-shaped pole piece 41 reverses the magnetic pole polarities of the pole piece and causes rotation of the target as previously described.

To preclude the possibility of windings 42 and 43 being simultaneously actuated by simultaneous conduction through SCR 70 and SCR 60, the fault indicator includes, in accordance with one aspect of the invention, provision for introducing a predetermined time delay in conduction through SCR 70 following occurrence of a fault current in conductor 12. This is accomplished by resistor 72 and capacitor 74, which together form an RC time constant in the gate circuit of SCR 70. Upon closure of the contacts of reed switch 56 it is necessary that capacitor 74 charge through resistor 72 to the threshold voltage of bilateral diode 71 before sufficient gate electrode current is supplied to SCR 70 to initiate conduction in that device.

The actual time delay provided is determined by the resistance of resistor 72, the capacitance of capacitor 74, the threshold voltage of bilateral diode 71, and the voltage level developed means capacitor 58, and is designed to insure that should a fault occur simultaneously with the periodic energization of winding 43, capacitor 57 will have completely discharged through that winding prior to winding 42 being energized to signal the fault. In practice, force 36 volt voltage level access capacitor 58 and a 20 volt threshold voltage level for bilateral diode 71, the time delay may be in the order of 180 microseconds, with a resistor 72 of 1800 ohms and a capacitor 74 of 0.1 microfarads.

Figure 10:
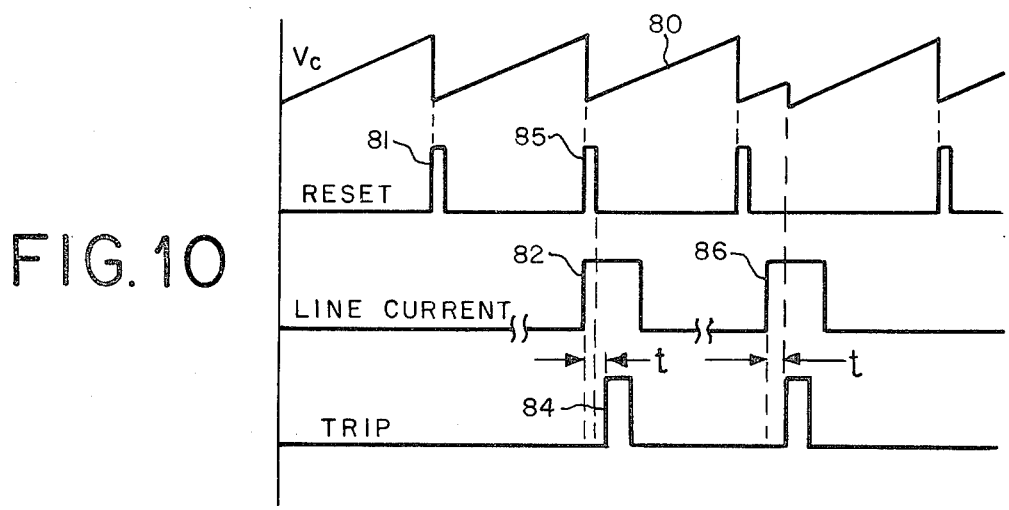
FIG. 10 is a graphical depiction of certain time, voltage and current relationships within the fault indicator circuitry useful in understanding the operation of the fault indicator.

The time delay relationship can be seen by referring to the waveforms illustrated in FIG. 10. Under normal line current conditions it is seen that the voltage Vc developed across capacitor 57 and depicted by waveform 80 progressively increases until the threshold level of bilateral diode 62 is reached, at which time SCR 60 is rendered conductive and a reset current dipicted by waveform 81 is repetitively caused to flow through reset winding 43.

Upon occurrence of a fault current in conductor 12, as depicted by waveform 82, trip winding 42 is energized after a delay interval t, as shown by waveform 84. Should the fault current occur simultaneously with a reset pulse, as shown by waveform 85, capacitor 57 will have completely discharged through winding 43 prior to winding 42 being energized, as a result of the time delay period t. If it were not for this delay period, windings 42 and 43 would be simultaneously energized, resulting in the production of opposing magnetic fields in pole piece 41 and raising the possibility of rotor 35 not responding to the fault. Typically, the reset current pulses applied to windings 42 and 43 have a duration of approximately 20 microseconds, and fault currents existing in conductor 12 have a duration of one quarter cycle, or approximately four miliseconds in a 60 hertz system.

Should a fault occur before the reset pulse, as illustrated by waveform 86, the then occuring reset cycle will be interrupted by discharge of capacitor 57 through diode 59 and SCR 70 so that no possibility exists of a reset pulse occuring simultaneously with the ensueing delayed reset pulse. Upon discharge of capacitors 57 and 58 through winding 42, the reset cycle begins anew as SCR 70 again becomes non-conductive.

Referring to FIGS. 4 and 7-9, to avoid any possibility of rotor 35 becoming stalled upon reversal of the magnetic polarities of pole piece 41, as might happen with a rotor being perfectly centered between the poles of pole pieces 41 and having a degree of bearing friction, the fault indicator includes, in accordance with another aspect of the invention, an auxiliary U-shaped pole piece 90 positioned adjacent target magnet 40 coaxial with and at an angle to pole piece 41.

For reasons well known to the art, the existence of a magnetic field between the poles of pole piece 41 results in the production of induced magnetic poles on auxiliary pole piece 90 of opposite gender to the most adjacent poles of pole piece 41. This is illustrated in FIGS. 7-9, and results by reason of the auxiliary pole piece 90 becoming included in the magnetic flux path between the poles of pole piece 41.

The effect of the magnetic poles induced in auxiliary pole piece 90 is that upon reversal of the gender of the poles of pole piece 50 following occurrence of a fault current the auxiliary poles exert a rotational force on the most adjacent poles of the permanent rotor magnet 40 associated with target 35. This results in a rotational moment being exerted on the target, tending to turn the target in a predetermined (counter-clockwise in FIGS. 7-9) direction such that the target is precluded from remaining in its reset position, even if it should be perfectly positioned and have a degree of bearing friction. Once rotation has been established, as shown in FIG. 8, the greater force of the main pole piece 41 over-comes the effect of the auxiliary pole piece 90 and rotation continues until the targe is aligned as shown in FIG. 9.

Thus, the provision of the auxiliary pole piece 90 increases the reliability of the fault indicator. Because the auxiliary pole piece is formed from a single strip of magnetizable material, the addition of the pole piece can be accomplished with minimum added manufacturing cost. Furthermore, the auxiliary pole piece can be conveniently mounted directly to the exterior surface of windings 42 and 43 by means of a quantity of epoxy cement 91 (FIG. 4), thereby obviating the need for additional mounting provisions within housing 21. While the auxiliary pole piece has been shown as a U-shaped member in conjunction with a U-shaped main magnetic pole piece, it will be appreciated that the pole pieces may have other shapes and forms for other specific applications in which the invention is practiced.

A self-resetting fault indicator has been described which incorporates novel refinements which improve reliability and performance. By the addition of a time delay network to the fault detector trip circuit the possibility of a fault not being indicated as a result of simultaneous occurrence of a fault and reset pulse is avoided, and by the addition of an auxiliary pole piece reliability of the target in responding to a fault current is improved. While these improvements have been shown in a fault indicator of the type intended for mounting on an elbow type connector, it will be appreciated that the improvements can be incorporated in other types of self-resetting fault indicators as well, such as those intended for clamp-on installation on an electrical conductor, and those intended for direct connection to an external source of excitation. In fact, the improvements incorporated in the illustrated fault indicator can be incorporated in any type of fault indicator which utilizes electrical trip and reset circuitry in conjunction with mechanical indicating means.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating the occurrence of a fault current in an electrical conductor, comprising, in combination:
    a housing;
    status indicating means having a reset-indicating state and a fault-indicating state;
    first circuit means for conditioning said status indicating means to said reset state, said first circuit means being periodically operable from an external excitation source;
    second circuit means for conditioning said status indicating means to said fault-indicating state in response to an applied control affect;
    fault detecting means responsive to occurence of a fault current in the conductor; and
    time delay means responsive to detection of a fault by said fault detecting means for actuating said second circuit means after a predetermined delay period following the fault to preclude simultaneous actuation of said first and second circuit means.

2. A fault indicator as defined in claim 1 wherein said first circuit means is rendered inoperable for a predetermined time period greater than said predetermined delay period following operation of said second circuit means.

3. A fault indicator as defined in claim 1 wherein said status indicating means comprise a mechanical member having a first position corresponding to said reset state, and a second position corresponding to said fault-indicating state, and wherein said circuit means each include a winding for generating a magnetic field for positioning said mechanical member.

4. A fault indicator as defined in claim 1 wherein said mechanical member is rotatably mounted within said housing, and wherein at least a portion of said member is visible from the exterior of said housing.

5. A fault indicator as defined in claim 3 wherein said first and second circuit means include first and second silicon controlled rectifiers for controlling current flow to said windings, respectively, and wherein said time delay means comprise an RC time delay circuit coupled to the gate electrode of said second silicon controlled rectifier.

6. A fault indicator as defined in claim 5 including first and second capacitors for supplying current to said first and second silicon controlled rectifiers, and unidirectional current coupling means between said capacitors whereby said first circuit means is operable from both said first and second capacitors, and said second circuit means is operable only from said second capacitor, for energizing said windings.

7. A fault indicator for indicating the occurrence of a fault current in an electrical conductor, comprising, in combination:
a housing;
status indicating means comprising a target member having a reset-indicating position and a fault-indicating position;
first circuit means including a winding in magnetic communication with said target member for positioning said target member to said reset position, said first circuit means being periodically operable from an external excitation source;
second circuit means including a winding in magnetic communication with said target member for positioning said target member to said fault-indicating position in response to an applied control affect;
said first circuit means being inoperable for a predetermined period of time following actuation of said second circuit means;
fault detecting means responsive to occurence of a fault current in the conductor; and
time delay means responsive to detection of a fault by said fault detecting means for actuating said second circuit means after a predetermined delay period less than said predetermined period of time following the fault to preclude simultaneous actuation of said first and second circuit means.

8. A fault indicator as defined in claim 7 wherein said target member is rotatably mounted within said housing, and wherein at least a portion of said target member is visible from the exterior of said housing.

9. A fault indicator as defined in claim 7 wherein said first and second circuit means each include a winding, and first and second silicon controlled rectifiers for controlling current flow to said windings, respectively, and wherein said time delay means comprise an RC time delay circuit coupled to the gate electrode of said second silicon controlled rectifier.

10. A fault indicator as defined in claim 9 including first and second capacitors for supplying current to said first and second silicon controlled rectifiers, and unidirectional current coupling means between said capacitors whereby said first circuit means is operable from both said first and second capacitors, and said second circuit means is operable only from said second capacitor, for energizing said windings.

11. A fault indicator for indicating the occurrence of a fault current in an electrical conductor, comprising, in combination:
a housing;
status indicating means comprising a permanently magnetized target member within said housing having a first position corresponding to a reset state, and a second position corresponding to a fault indicating state;
means comprising a main magnetic pole piece having at least one magnetic pole arranged in magnetic flux communication with said target member;
means for conditioning said main magnetic pole piece from a first magnetic state of one magnetic gender to a second magnetic state of opposite magnetic gender upon occurrence of a fault current in said conductor, said target member being urged from said first position to said second position as a result of said change in magnetic state; and
means comprising an auxiliary pole piece having at least one magnetic pole in magnetic flux communication with said target member and with said main magnetic pole piece, and magnetizable as a result of the magnetic flux within said main magnetic pole piece for assisting movement of said target member from said first reset-indicating position to said second fault-indicating position.

12. A fault indicator as defined in claim 11 wherein said target member is rotatably mounted within said housing, and wherein at least a portion of said target member is viewable from the exterior thereof.

13. A fault indicator as defined in claim 12 wherein said main and auxilliary pole pieces each comprise a generally U-shaped member coaxial with said rotatably mounted target and angularly mounted with respect thereto.

14. A fault indicator as defined in claim 13 wherein said target member comprises a disc-shaped member aligned in a plane generally perpendicular to the axis of said U-shaped pole pieces and in close proximity to the projecting ends thereof.

15. A fault indicator for indicating the occurrence of a fault current in an electrical conductor, comprising, in combination:
a housing;
status indicating means comprising a generally disc-shaped permanently-magnetized target member rotatably mounted within said housing and having a first position corresponding to a reset state, and a second position corresponding to a fault indicating state;
means comprising a generally U-shaped main magnetic pole piece arranged coaxially with said target member and having magnetic poles in magnetic flux communication with first diametrically opposed portions of said target member;
means for conditioning said main magnetic pole piece from a first magnetic state of one magnetic gender to a second magnetic state of opposite magnetic gender upon occurrence of a fault current in said conductor, said target member being urged from said first position to said second position as a result of said change in magnetic state; and
means comprising a generally U-shaped auxilliary pole piece arranged coaxially with said target member and having magnetic poles in magnetic flux communication with second diametrically opposed portions of said target member angularly displaced from said first diametrically opposed portions, and with said main pole piece and magnetizable as a result of the magnetic flux within said main magnetic pole piece, for assisting movement of said target member from said first reset-indicating postion to said second fault-indicating position.

* * * * *

UNITED STATES PATENT AND TRADEMARK OFFICE
CERTIFICATE OF CORRECTION

PATENT NO. : 4,234,847
DATED : November 18, 1980
INVENTOR(S) : Edmund O. Schweitzer, Jr.

It is certified that error appears in the above-identified patent and that said Letters Patent are hereby corrected as shown below:

Column 6, line 58: Change "dipicted" to --depicted--.

Column 7, line 8: Change "miliseconds" to --milliseconds--.

Column 7, line 11: Change "occuring" to --occurring--.

Column 7, line 14: Change "occuring" to --occurring-- and "ensueing" to --ensuing--.

Column 7, line 49: Change "targe" to --target--.

Signed and Sealed this

Seventeenth Day of February 1981

[SEAL]

Attest:

RENE D. TEGTMEYER

Attesting Officer     Acting Commissioner of Patents and Trademarks